US008664746B2

(12) United States Patent
Korycinski et al.

(10) Patent No.: US 8,664,746 B2
(45) Date of Patent: Mar. 4, 2014

(54) GETTERING METHOD FOR DIELECTRICALLY ISOLATED DEVICES (75) Inventors: Janusz Karol Korycinski, Singapore (SG); Wanliang Wen, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 27 days.

(21) Appl. No.: 13/237,671

(22) Filed: Sep. 20, 2011

(65) Prior Publication Data

US 2013/0069203 A1 Mar. 21, 2013

(51) Int. Cl.
H01L 29/30 (2006.01)

(52) U.S. Cl.
USPC ............ 257/617; 257/E29.107; 257/E21.318; 438/402

(58) Field of Classification Search
USPC .......... 257/913, 682, E21.318, E21.321, 617, 257/E29.107; 418/FOR. 144; 438/402
See application file for complete search history.

(56) References Cited

U.S. PATENT DOCUMENTS

| | | | | |
|---|---|---|---|---|
| 6,084,255 A * | 7/2000 | Ueda et al. | ..................... | 257/204 |
| 6,399,460 B1 * | 6/2002 | Yamaguchi et al. | ........... | 438/412 |
| 6,444,534 B1 * | 9/2002 | Maszara | ........................ | 438/311 |
| 6,524,928 B1 * | 2/2003 | Hirabayashi | ................... | 438/402 |
| 6,646,306 B2 * | 11/2003 | Iwamatsu et al. | ............. | 257/347 |
| 6,676,748 B1 * | 1/2004 | Himi et al. | ......................... | 117/8 |
| 6,830,986 B2 * | 12/2004 | Yamashita et al. | ............. | 438/402 |
| 7,229,891 B2 * | 6/2007 | Coleman | ........................ | 438/402 |
| 2010/0090303 A1 * | 4/2010 | Takizawa | ....................... | 257/432 |
| 2010/0264510 A1 * | 10/2010 | Ohtsuki et al. | ................ | 257/506 |

FOREIGN PATENT DOCUMENTS

EP    2207194 A1 *  7/2010

OTHER PUBLICATIONS

Bronner et al., "Gettering in Low Temperature VLSI Processes," Integrated Circuits Laboratory, Stanford University, Stanford, CA, pp. 18-19.
Lu et al., "Gettering Effect of High-Dose Arsenic Implantation and Boron Diffusion on Gate Oxide Integrity in Trench Isolated high Voltage Silicon-on-Insulator Process," IEEE 05 CH37616 43$^{rd}$ Annual International Reliability Physics Symposium, San Jose, 2005.
Rink et al., "Relation between Surface Contamination of Metals and Defect Formation in Si during Oxidation of Bulk- and SOI-Wafers," *Solid State Phenomena* 92:93-96, 2003.
Zanchi et al., "On-chip Probes for Silicon Defectivity Ranking and Mapping," Proceedings of the 38$^{th}$ IEEE International Reliability Physics Symposium, 2000, pp. 370-376, 2000.

* cited by examiner

*Primary Examiner* — Trung Q Dang
(74) *Attorney, Agent, or Firm* — Seed IP Law Group PLLC (57) ABSTRACT

A silicon on insulater (SOI) wafer is provided. A dielectric layer is formed on an active silicon substrate of the wafer. The dielectric layer is patterned and etched to expose selected portions of the silicon substrate. Impurities are then introduced into the exposed portions of the silicon substrate to act as gettering regions. The dielectric layer is then removed and an epitaxial layer of silicon is grown on the silicon substrate. Trenches are etched in the epitaxial layer of silicon through the gettering regions, partially removing the gettering regions and any contaminants contained therein. Remaining portions of the gettering regions still act as gettering regions during subsequent process steps.

9 Claims, 7 Drawing Sheets

GETTERING METHOD FOR DIELECTRICALLY ISOLATED DEVICES

BACKGROUND

1. Technical Field

The present disclosure relates to the field of integrated circuit fabrication. The present disclosure relates more particularly to the gettering of semiconductor wafers.

2. Description of the Related Art

Integrated circuits are typically fabricated in and on substrates of monocrystalline semiconductor material. Integrated circuits often include MOS or bipolar transistors formed in the monocrystalline semiconductor substrate. MOS transistors include source, drain, channel, and body regions formed in the monocrystalline semiconductor substrate. Bipolar transistors typically include emitter, collector, and base regions in the monocrystalline semiconductor substrate.

In order to promote reliable and efficient function of the transistors, it is desirable to remove unwanted impurity atoms from the monocrystalline semiconductor substrate. Impurity atoms, especially copper, iron, and gold atoms, in the monocrystalline semiconductor substrate can have adverse effects on the function of transistors. Impurity atoms can cause junction leakage in which leakage currents increase the power dissipation of the circuit and cause unwanted heating of the circuit. Impurity atoms can also create trap states in the bandgap of the monocrystalline semiconductor substrate. This means that electrons in the area of the impurity atom may become trapped in an energy state within the bandgap rather than in the valence or conduction bands outside of the bandgap. These energy trap states cause degradation in the function of the transistors which rely on the bandgap of the semiconductor atoms in the monocrystalline semiconductor substrate for proper function. If too many impurity atoms are in the substrate then individual transistors may perform poorly or not at all. Function of the entire integrated circuit may be jeopardized if too many transistors are affected.

Gettering is a process that removes impurity atoms from the monocrystalline semiconductor substrate. Even if gettering is very thorough during crystal growth, impurity atoms may enter the substrate in subsequent processing steps. Gettering may therefore be performed during and after subsequent processing steps to remove impurities from the bulk regions of the monocrystalline semiconductor substrate in which the transistors will be formed.

Processes for gettering semiconductor substrates are generally divided into two categories: Extrinsic gettering and intrinsic gettering. In extrinsic gettering external influences are applied to introduce stress in the monocrystalline semiconductor lattice. The stressed areas act as traps for the impurity atoms.

Extrinsic gettering can be performed by applying stress or damage to the backside of the semiconductor substrate. This can be accomplished by sandblasting the backside of the wafer, scoring the backside of the wafer, irradiating the backside of the wafer with a high intensity laser beam, or bombarding the backside of the wafer with high energy ions. Each of these methods can introduce stressed areas in the semiconductor lattice that will act as traps for the impurity atoms and thus perform gettering.

Intrinsic gettering methods include precipitating saturated oxygen out of the wafer and creating stressed areas in the semiconductor lattice that eventually disrupt areas of the lattice and create trapping areas for impurities. This means that a wafer should have some amount of oxygen put in during formation of the semiconductor lattice. This can be an improvement over extrinsic gettering because no further wafer processing except for heating is needed to perform the gettering. Additionally the gettering sites can be larger than with some extrinsic methods and the gettering sites are closer to the bulk regions. However, these typical extrinsic and intrinsic gettering methods can be difficult or impossible to perform in silicon-on-insulator (SOI) wafers.

Gettering may be particularly difficult in SOI chips in which an insulating substrate is attached to the backside of the bulk monocrystalline semiconductor substrate. Having an insulating substrate coupled to the back side of the wafer greatly increases the difficulty of gettering of the monocrystalline semiconductor substrate.

BRIEF SUMMARY

The present disclosure provides a method and structure for gettering integrated circuits. According to one embodiment gettering sites are formed in a monocrystalline semiconductor substrate of an integrated circuit. The gettering sites are regions of high dopant concentration which trap impurity atoms such as copper, iron and gold. Over time, the level of impurity atoms in the monocrystalline semiconductor substrate will decrease as the gettering continues and the function of the integrated circuit is improved.

In one embodiment, the monocrystalline semiconductor substrate is divided into a plurality of bulk regions separated from each other by trench isolation regions. Each bulk region typically includes a plurality of transistors. In each of the bulk regions one or more gettering sites are formed below or laterally from the transistors. In this way each bulk region has a gettering site for removing impurity atoms from the semiconductor substrate. The gettering sites remain in the silicon after processing and packaging of the integrated circuit for continued gettering of the bulk regions for as long as the circuits exist.

In one embodiment the integrated circuit is formed on a SOI substrate. The gettering sites may be formed at a junction of the monocrystalline semiconductor substrate and the buried insulator region of the SOI. The gettering sites may be formed by ion implantation of dopant atoms into the monocrystalline semiconductor substrate. Trench isolation regions may then be etched into the monocrystalline semiconductor substrate. Each trench isolation region may be formed through a central portion of a respective gettering site. This serves to remove a central portion of the gettering site while leaving lateral portions of the gettering site on either side of the isolation trench. In this way a central portion of the gettering site, as well as gettered impurity atoms are removed while leaving a portion of the gettering site on each side of the trench isolation for continued gettering.

DETAILED DESCRIPTION

Figure 1:
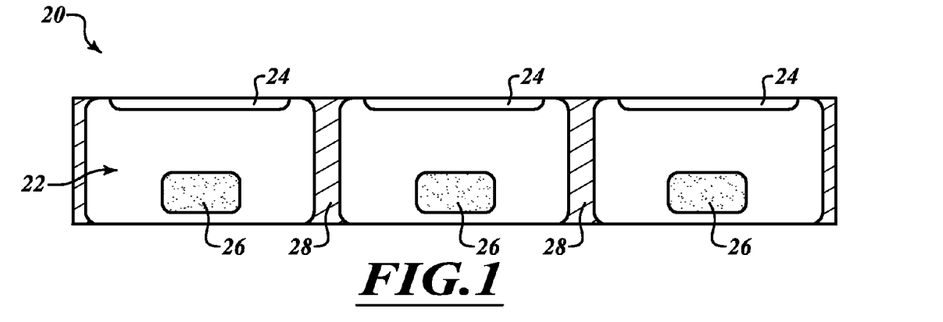
FIG. 1 is a simplified cross-section of an integrated circuit according to one embodiment of the invention.

FIG. 1 illustrates a semiconductor die 20 according to one embodiment. The semiconductor wafer 20 is delineated into a plurality of separate bulk regions 22. The bulk regions 22 include a plurality of transistors 24. Each bulk region includes a gettering site 26. The bulk regions 22 are separated from each other by isolation regions 28. The bulk regions 22 are regions of a monocrystalline semiconductor substrate each designated for the formation of a plurality of transistors 24.

In one embodiment, each bulk region 22 contains a plurality of transistors 24 of a certain type. For instance one bulk region 22 may contain a plurality of NMOS transistors while an adjacent bulk region 22 may contain PMOS transistors. The NMOS and PMOS bulk regions 22 are separated from each other by separation regions 28. The separation regions 28 may be shallow trench isolation, deep trench isolation, LOCOS, field oxide, or other isolation structures. The isolation regions 28 are present to ensure that voltages or electric fields in one bulk region 22 do not interfere with another bulk region 22. Such interference can negatively affect the performance of transistors 24 in the bulk regions 22.

It is often desirable to hold the source and body regions of all NMOS transistors in one bulk region 22 at the low voltage, while holding the source and body regions of PMOS transistors in another bulk region 22 at the high voltage. This can help to prevent unwanted leakage currents and transistor lockup in individual transistors 24. When NMOS bulk regions 22 border PMOS bulk regions 22 it is possible for transistors 24 in one region 22 to be negatively impacted by voltages present in another region 22. In order to limit these negative effects, bulk regions 22 are isolated from each other by isolation regions 28.

Another potential danger to the proper functioning of transistors 24 in the bulk regions 22 is the presence of mobile impurity atoms. Mobile impurity atoms are for example Cu, Au, Fe, or other types of atoms that may enter a semiconductor substrate and become mobile within the semiconductor substrate. Such impurity atoms are often mobile even at common temperatures, for example room temperature or standard operating temperatures. Due to the mobility of the impurity atoms, they may migrate through the bulk regions 22 in proximity with the transistors 24. Once in proximity with the transistors 24, the impurity atoms can negatively impact performance of the transistors 24.

The term "impurity atoms" as used herein refers to those atoms which will tend to destroy the controlled conduction properties of the transistors and are not acting as dopants. Boron, arsenic and phosphorous are common dopants for transistors in silicon which provide controlled conduction of the transistor. These are considered dopants but not impurities as these terms are used herein. Gold, copper and iron are examples of impurity atoms which are not dopants. These impurity atoms tend to destroy the controlled conduction of transistors in silicon rather than promote it.

Gettering is the process of removing mobile impurity atoms from the proximity with transistors 24 in the bulk region 22. Gettering may include removing the mobile impurity atoms from the bulk region 22 entirely, simply restricting the movement of impurity atoms from the transistors 24, or trapping the impurity atoms in gettering sites 26 so they are no longer mobile. Gettering sites 26 can be formed by creating preferential energy regions for mobile impurity atoms. The mobile impurity atoms are attracted to the preferential energy regions and tend to stay in such regions.

In one embodiment a gettering site 26 is formed in each bulk region 22. By placing a gettering site 26 in each bulk region 22, the number of free impurity atoms is greatly reduced. This reduced number of impurity atoms provides improved function of the transistors 24.

It is beneficial have the ability to continue gettering after the processing steps for formation of the integrated circuits on the semiconductor die 20 is complete and the die has been packaged. One reason for this is because during manufacture of the semiconductor die 20, a large number of processing steps are performed on the wafer including multiple steps of depositing and patterning metals and other possible sources of impurity atoms. Metal atoms such as Cu, Ni, and others can be very mobile in a semiconductor formation process and sometimes move through dielectric layers and into the semiconductor lattice. Lead frames are often made of Cu and many times are Au plated. Even though significant measures are taken to reduce the exposure of the semiconductor lattice to impurity atoms during processing and packaging, there may still be some impurity atoms that migrate into the semiconductor lattice. Once in the semiconductor lattice, if the impurity atoms migrate to bulk regions 22 of the semiconductor die 20, they may reduce the operational characteristics of the transistors and in some cases may even cause malfunction of transistors 24 in the bulk regions.

Impurity atoms might be found throughout the entire semiconductor die 20. When the bulk regions 22 of the semiconductor die 20 are separated from each other by isolation regions 28, impurity atoms tend to stay with the isolated bulk regions 22 and not migrate outside of the well. Having a gettering site 26 in each bulk region 22 allows for improved and continued gettering. The gettering regions 26 getter a large amount of impurity atoms during processing of the semiconductor die 20. Even after processing of the semiconductor die 20 is complete, the gettering sites 26 continue to getter remaining impurity atoms.

In one embodiment after the isolation regions 28 are formed, the gettering sites 26 are advantageously positioned in each bulk region 22. Each bulk region 22 therefore benefits from having a gettering site 26. When the mobile impurity atoms come into contact with the gettering sites 26 the impurity atoms become trapped by the gettering sites 26.

In one embodiment the gettering sites 26 are formed by ion implantation into the bulk regions 22 to make concentrated pockets of dopant atoms which provide trapping sites for the impurity atoms to be gettered. When the mobile impurity atoms come into contact with the gettering sites 26 the impurity atoms become trapped by the gettering sites 26. A gettering site 26 is distinguished from a doped source, drain, or channel regions of a transistor 24 by its location, concentration of atoms and spacing from other structures.

One purpose of a gettering site is to keep impurity atoms from the source, drain, and channel regions. In one embodiment the gettering sites 26 will include a higher concentration of dopant atoms than a source, drain, or channel region of a transistor 24. In one embodiment the gettering sites 26 are formed prior to formation of source, drain, or channel regions in order to trap a large number of impurities before formation of the drain, source, and channel regions. In this way impurity are trapped by the gettering sites 26 before they can be trapped in doped transistor regions.

In one embodiment the gettering sites 26 are formed by implanting energized antimony atoms into the semiconductor lattice in each bulk region 22. In one embodiment the gettering sites are formed by implanting other types of N or P type dopant atoms in very heavy concentrations into selected locations in the bulk regions 22 of the semiconductor lattice. Of course many other methods and materials may be used to form the gettering sites 26 in each bulk region 22.

In this disclosure the term "impurity atoms" or "impurities" will refer to the type of atoms or compounds that are the target of gettering efforts. Such impurity atoms may include Cu, Au, Fe, or other atoms which are typically gettered. The term "dopants" or variations thereof will generally refer to atoms intentionally placed in the semiconductor substrate under controlled conditions, for example to getter the impurity atoms. The term "dopants" in this application is not intended to refer to the impurity atoms which are to be gettered.

Figure 2:
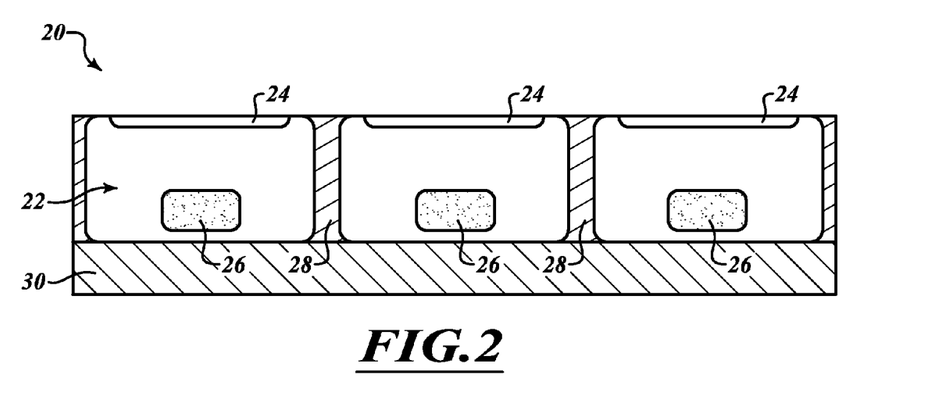
FIG. 2 is a simplified cross-section of an integrated circuit on a SOI substrate according to one embodiment of the invention.

FIG. 2 illustrates a semiconductor die 20 that is a silicon-on-insulator (SOI) wafer. The semiconductor wafer 20 is delineated into a plurality of separate bulk regions 22. The bulk regions 22 include transistors 24. Each bulk region includes a gettering site 26. The bulk regions 22 are separated from each other by isolation regions 28. The bulk regions 22 are generally formed of a monocrystalline semiconductor lattice. The semiconductor die further includes an insulator region 30. The insulator region 30 is, for example, the buried insulator layer of a SOI wafer.

Integrated circuits processed on SOI wafers have certain advantages over integrated circuits processed on typical non-SOI wafers. For example it is possible for bulk regions 22 to be completely electrically isolated from each other on a SOI die 22. This means that isolation regions 28 extend all the way through the monocrystalline semiconductor lattice of the bulk regions and abut the buried insulator layer 30. Because the isolation regions 28 abut the buried insulator region 30, there will be virtually no cross-talk or leakage currents between bulk regions 22.

However a disadvantage of the SOI wafer is that traditional extrinsic gettering methods that involve damaging the backside of the wafer to introduce stressed areas are difficult if not impossible to perform. This can mean that transistors 24 in SOI semiconductor dies 20 suffer greater interference from mobile impurity atoms in the semiconductor lattice because fewer of these atoms have been gettered.

One known gettering technique that is attempted for SOI involves forming heavily doped boron regions as gettering sites near the periphery of the die far, from the active components of the integrated circuit. However, this technique does not perform effective gettering of the entire silicon bulk substrate and many unwanted impurity atoms remain in the semiconductor lattice and are not trapped.

A SOI semiconductor die 20 according to one embodiment of the invention will obtain the beneficial effects of SOI technology in reducing leakage currents and cross-talk while also obtaining the benefits of strong gettering. According to one embodiment each bulk region 22 is electrically isolated from the other bulk regions 22. Each bulk region 22 also includes a gettering site 26. Unwanted impurity atoms that are introduced into the bulk regions 22 during processing are continuously gettered at sites 26.

In one embodiment the gettering sites 26 are formed by ion implantation into the bulk regions 22 to form concentrated pockets of atoms which form trapping sites for the impurity atoms to be gettered. When the mobile impurity atoms come into contact with the gettering sites 26 the impurity atoms become trapped by the gettering sites 26.

In one embodiment the gettering sites 26 are formed by implanting energized antimony atoms into the semiconductor lattice in the bulk regions 22. In one embodiment the gettering sites are formed by implanting boron atoms into the semiconductor lattice in the bulk regions 22. Of course many other methods and materials may be used to form the gettering sites 26 in each bulk region 22.

Figure 3:
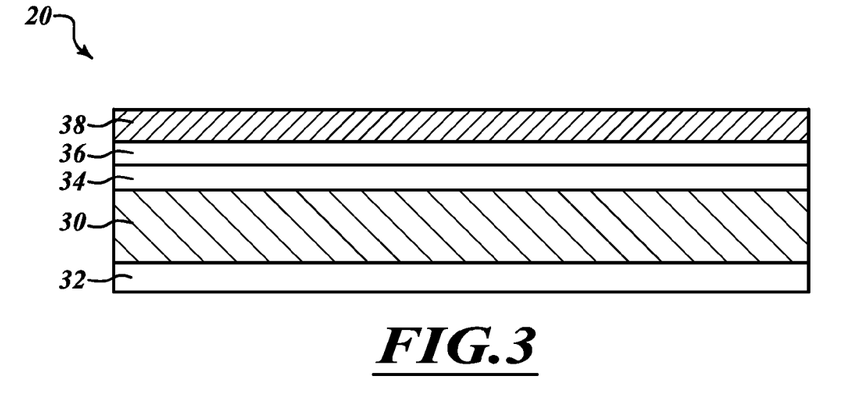
FIGS. 3-14 are simplified cross sections of an integrated circuit at progressive steps of processing to form gettering sites according to various embodiments of the invention.

FIG. 3 is a cross section of a SOI semiconductor die 20 according to one embodiment at an early stage of processing. Layer 30 is the buried insulator layer of a SOI die 20. The buried insulator layer 30 is, for example, a silicon oxide layer. The buried insulator layer is, in one example, approximately 1.5 μm thick. On the backside of the buried oxide layer 30 is backside semiconductor layer 32. The backside semiconductor layer 32 provides mechanical support and is, for example, a silicon layer approximately 650 μm thick. While the backside silicon layer 32 is illustrated as being a thin layer in FIG. 3, it will usually be much thicker than layers 30, 34, 36, and 38. Thus the layers illustrated are not necessarily drawn to scale and one of skill in the art will understand that the relative thicknesses of the layers maybe different from those shown in the figures.

Layer 34 is a monocrystalline semiconductor layer overlying the buried oxide layer 30. The monocrystalline semiconductor layer 34 generally ranges from 1.5 μm to 5 μm thick. In practice SOI wafers are generally shipped to integrated circuit manufacturers already including layers 30, 32, 34. Subsequent layers are generally added during by the integrated circuit manufacturers.

During manufacture, one or more layers 36 of monocrystalline semiconductor layer are formed on top of the monocrystalline semiconductor layer 34 by epitaxial growth. Each semiconductor layer 36 is, for example, 0.5 to 2 μm in thickness. The epitaxial growth may be performed for example in a heated environment in the presence of compounds containing silicon. Silicon atoms bond with the semiconductor layer 34 and form monocrystalline extension thereof. Processes for forming an epitaxial layer are well known in the art and will not be described in detail here. Any suitable process for forming layer 36 may be used. Because semiconductor layers 34 and the one or more epitaxial layers 36 form a single monocrystalline semiconductor lattice, they will be jointly referred to in subsequent figures as monocrystalline layer 37 hereafter. Three or more sublayers of epitaxially grown silicon may make up layer 37. An insulator 38 is formed on top of semiconductor layer 36. The insulator layer 38 is, for example, a silicon oxide layer 500 nm thick.

Figure 4:
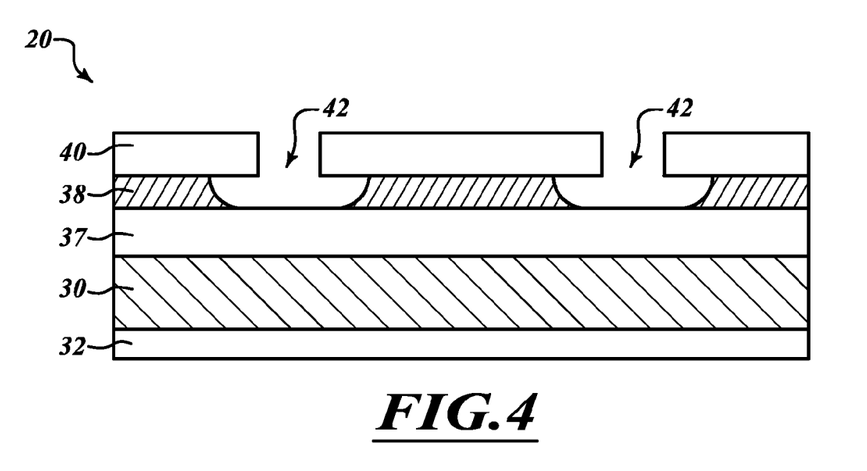

In FIG. 4 a photoresist layer 40 has been deposited on insulator layer 38 and patterned to open holes 42 in the photoresist layer. The exposed portions of the insulator layer 38 are then subjected to an isotropic etch. The etch is, for example, an HF etch or a buffered oxide etch (BOE). Of course the etchant may be any suitable etchant that will selectively etch the insulator layer 38 with respect to the semiconductor layer 37. The etch exposes the semiconductor layer 37 below the openings 42 in the photoresist.

The openings 42 are shown in the cross section of FIG. 4 as simple square openings in the photoresist 40, but in practice the openings 42 extend into and out of the page and follow the pattern of isolation trenches that will subsequently delineate bulk transistor regions in the semiconductor layer 37, as will be described in more detail below.

Figure 5:
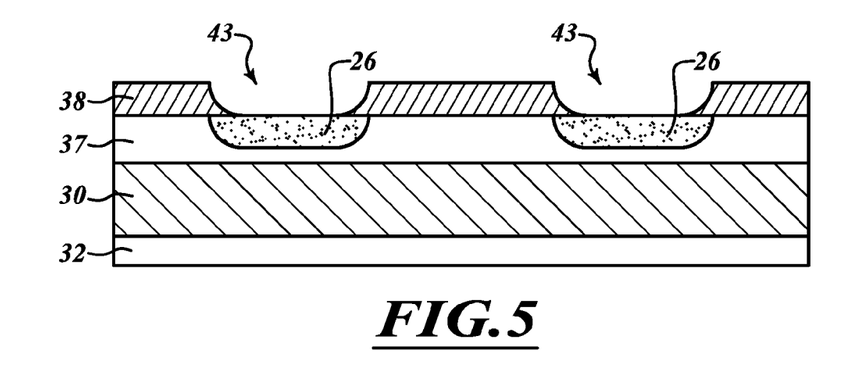

In FIG. 5 gettering sites 26 are formed in the semiconductor layer 37 by implanting ions into the semiconductor layer 37 through the openings 43 in the oxide layer 38. In one embodiment the gettering sites 26 are formed by injecting antimony ions through the openings in the oxide layer 38 into the semiconductor layer 37 with implantation energy of about 80 keV. The photoresist layer 40 is then removed. Next a diffusion step is performed to diffuse the dopant ions into the semiconductor layer 37. The diffusion step causes the antimony atoms to diffuse laterally and downward. The gettering sites 26 so that the gettering sites are about 7 μm wide.

In one embodiment the diffusion step includes heating the semiconductor die 20 to a temperature of 1150° C. for about two hours. The dopant concentration in the gettering sites is, for example, about $5 \times 10^{19}$ cm$^3$. In other embodiments the dopant concentration may be much higher than this, for example in the range of $10^{20}$ cm$^3$. In other embodiments the dopant concentration is lower or higher than these exemplary figures. Of course the gettering sites 26 may be formed by implanting species of dopant atoms other than Antimony, such as Boron, Phosphorus, Arsenic, or any other suitable dopant atoms. The gettering sites 26 may be formed in ways other than those given by example above as will be clear to those of skill in the art in light of the present disclosure.

The gettering sites 26 trap impurity atoms as described above. The high dopant concentrations are attractive low energy regions for mobile impurity atoms. The mobile impurity atoms eventually migrate to the gettering sites 26 and are trapped. Thus as long as the gettering sites 26 are present, the dopant concentrations act as trapping sites for the impurity atoms.

Figure 6:
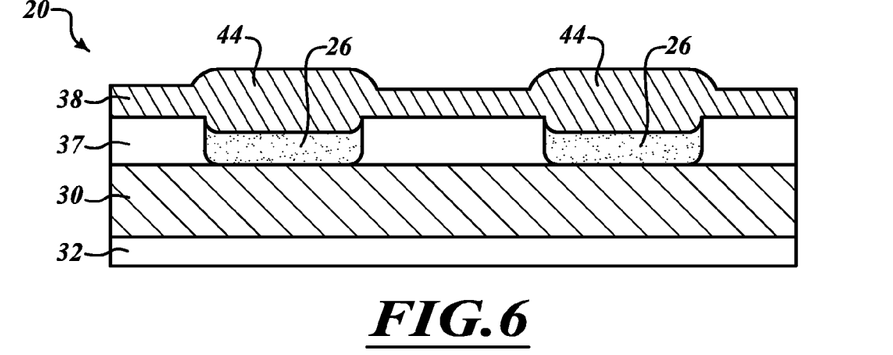

As shown in FIG. 6, silicon oxide growth is then performed in the openings 43 to form raised oxide regions 44. The raised oxide regions 44 are, for example, 100 nm higher than oxide layer 38. The raised oxide regions 44 consume some of the silicon in the gettering sites 26 in the semiconductor layer 37.

Figure 7:
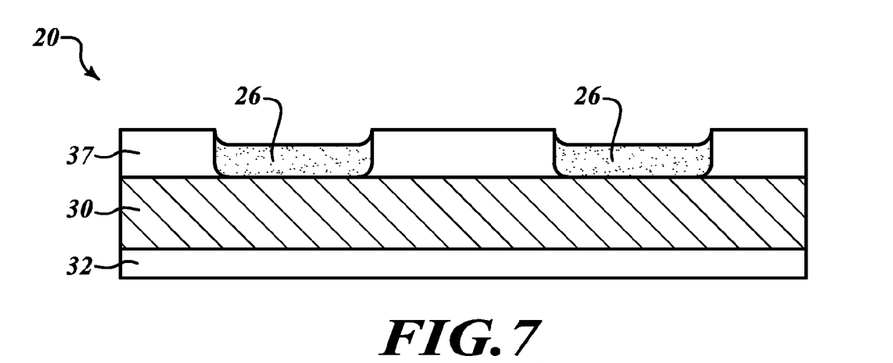

In FIG. 7 the oxide layer 38 and the raised oxide regions 44 are etched and removed. The etch may be performed by an HF etch, a buffered oxide etch, or any other suitable etch. The removal of the raised oxide regions 44 leaves a small depression in the gettering site 26 relative to the surface of the semiconductor layer 37.

Figure 8:
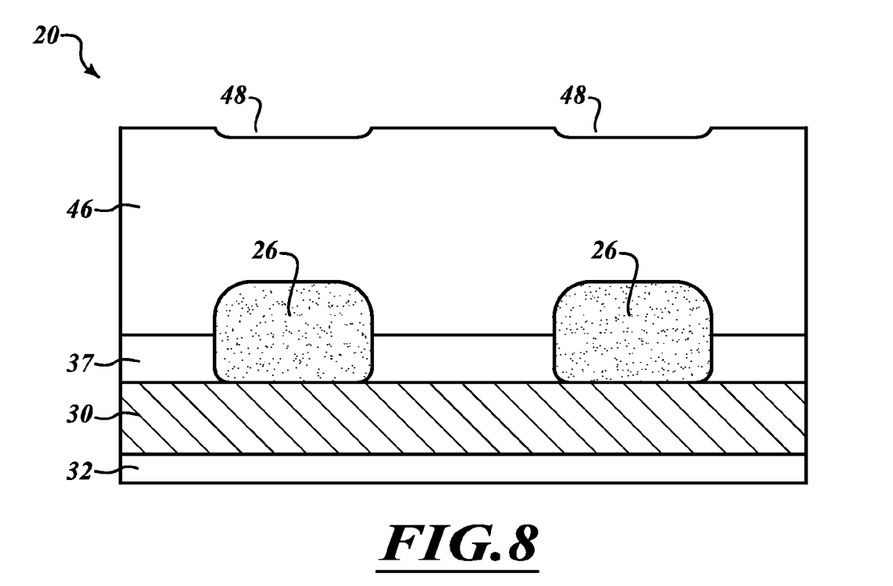

In FIG. 8 a monocrystalline semiconductor layer 46 is formed on the semiconductor layer 37. The monocrystalline semiconductor layer 46 is formed by of an epitaxial growth. The monocrystalline semiconductor layer is, in one example, about 7.5 μm thick.

When a semiconductor layer is grown by means of an epitaxial growth, the layer will assume the general shape of the layer from which it grew. As can be seen in FIG. 8, the epitaxial layer 46 retains the basic shape of the semiconductor layer 37 below it. Depressions 48 appear in the epitaxial layer 46 above the gettering sites 26. This is because the gettering sites 26 also had depressions in them as seen in FIG. 6. Also, the dopant in gettering sites 26 diffuse a certain distance into the epitaxial layer 46 such that a portion of the gettering sites 26 are in each of the layers 46 and 37. In practice the diffusion may not be uniform, and FIG. 8 is a general depiction of the shape of the gettering sites 26.

Because semiconductor layer 46 is formed by an epitaxial growth from semiconductor layer 37, the layers 46 and 37 form a single monocrystalline semiconductor lattice. Thus, in subsequent figures layers 46 and 37 will be shown as a single semiconductor layer 49.

Figure 9:
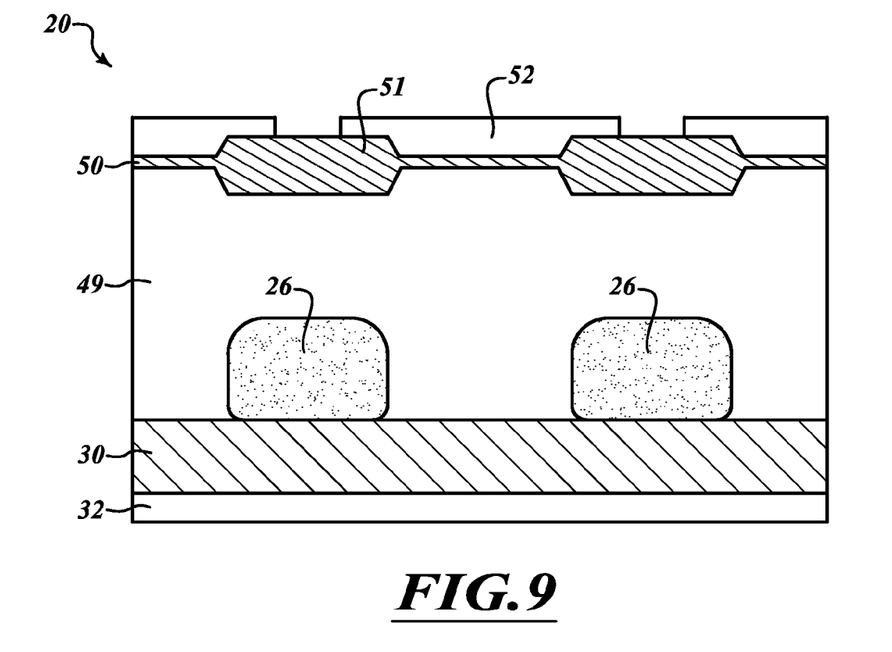

In FIG. 9 an oxide layer 50 has been formed on semiconductor layer 49 with thicker oxide regions 51 being formed above the gettering sites 26. The oxide regions 51 can be formed according to any conventional methods for forming isolation oxide regions such as standard Fox (Field oxide), LOCOS, poly buffered LOCOS, trench isolation, shallow trench isolation. Such methods are well known to those of skill in the art will not be described in great detail here. A photoresist layer 52 is formed over the oxide layer 50 and patterned to form openings above the oxide regions 51.

Deep trench isolation regions 27 are etched in the field oxide regions 51 and in the semiconductor layer 49 below the oxide regions 51. In one embodiment this etch is performed in two steps. In a first step the oxide region 51 is etched using an etchant that etches silicon dioxide selectively more quickly relative to silicon. This can be a plasma dry etching process or etchant may be HF, BOE, or any other etchant that etches silicon dioxide selectively relative to silicon. In a second step the semiconductor layer 49 is etched using an etchant that etches silicon relative to silicon dioxide. The second etch etches the semiconductor layer 49 all the way to the buried insulator layer 30. Any suitable etchant may be used for the second etch. Such etchants are well known in the art and will not be described in detail here. The two etches leave the structure shown in FIG. 10.

Figure 10:
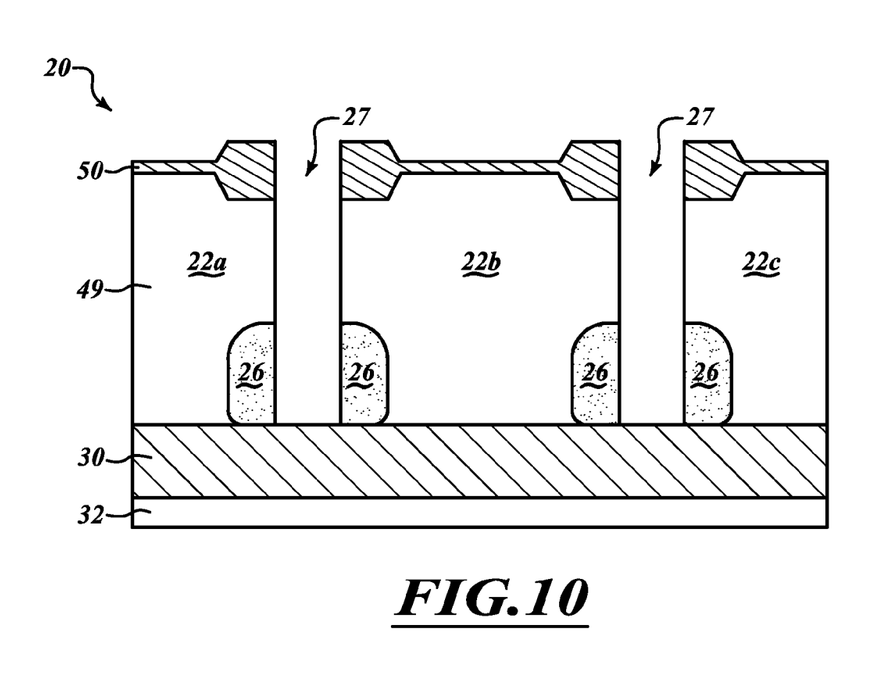

The deep trench isolation regions 28 have been etched through the oxide regions 51, the semiconductor layer 49, and the gettering sites 26. In forming the deep trench isolation regions 27, a central portion of each gettering site 26 has been removed. The removal of the central portion of the gettering sites 26 is beneficial at this stage because it removes a large portion of the impurity atoms that have been gettered during the time prior to formation of the deep trench isolation regions 27. As soon as gettering sites 26 are formed, they begin to getter impurity atoms in the semiconductor layer 49. A large amount of impurity atoms are gettered before formation of the deep trench isolation regions 27 and removal of the central portion of the gettering sites 26. Thus, when the central portions of the gettering sites 26 are removed, a very high concentration of impurity atoms are removed as well. This prevents the subsequent escape from the gettering sites 26 by some of the impurity atoms. Advantageously, portions of the gettering sites 26 still remain on both sides of each isolation trench 27 to continue the gettering function throughout the remainder of processing and the life of the integrated circuit. The width of the deep trench isolation 27 is about 1.5 μm in one example. The remaining portions of the gettering sites 26 are about 2.5 μm wide in one example.

Isolation trenches 27 separate bulk regions 22a, 22b, 22c from each other. Each bulk region 22a, 22b, 22c will host a plurality of active circuit components, for example, transistors, as will be described in more detail below. Each bulk region 22a, 22b, 22c has a gettering site 26 surrounding the lower edge of the bulk region 22a, 22b, 22c. Each gettering site 26 is in a lower corner of a bulk region 22a, 22b, 22c in contact with a deep trench isolation region 28 and the buried insulator layer 30. Because the gettering sites 26 are in each bulk region 22 and surround a lower perimeter of the bulk regions 22a, 22b, 22c, the gettering regions provide effective gettering for the entire die 20. Of course in some embodiments not every bulk region has a gettering site 26. As many or as few gettering sites 26 as desired may be used.

Figure 11:
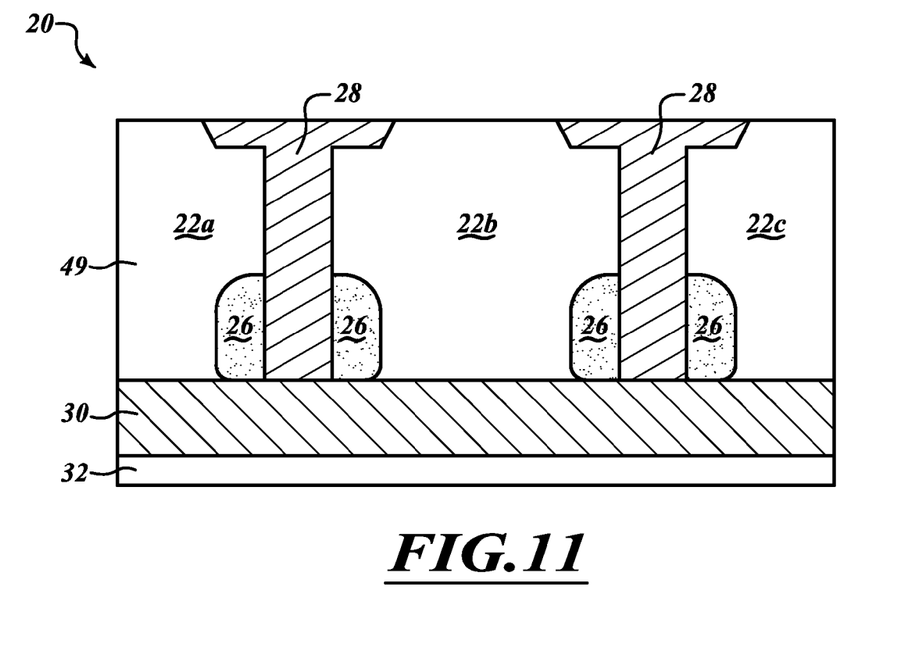

In FIG. 11 the deep trench isolation regions 27 are filled with an insulating material to form isolating regions 28. The insulating material is, in one example, silicon dioxide. In other embodiments the trench isolation regions 28 may be filled with other insulating materials such as a low k dielectric, aerogel, oxide-polycrystalline silicon film stack or any other suitable dielectric material.

The insulating material may be deposited in the deep trench isolation regions 27 by an oxide growth, a conformal oxide deposition, or any other suitable methods for forming an insulating layer in the deep trench isolation regions 27. The insulating material in the isolation regions 28 as well as the dielectric layer 50, and field isolation regions, are then subject to a planarization so that the insulating materials of the field oxide region 51 and the isolation regions 28 are level with the top surface of the semiconductor layer 49 as shown in FIG. 10. The planarization may be performed by chemical mechanical planarization (CMP), a timed etch, or any other suitable methods for forming a planar surface.

Figure 12:
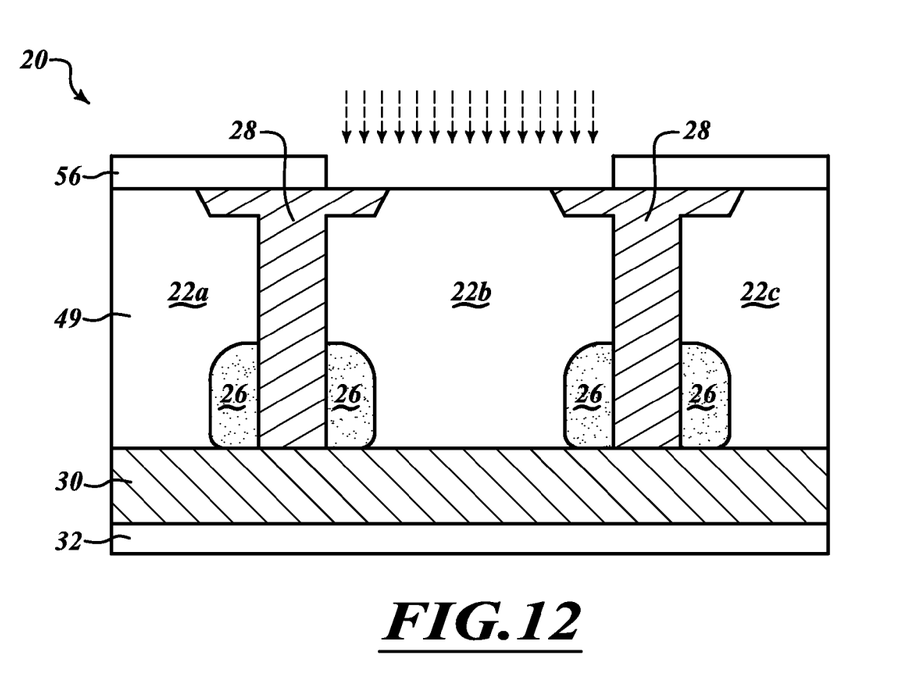

In FIG. 12 a photoresist layer 56 is deposited on the surface of the semiconductor layer and openings are formed to expose the surface of the semiconductor layer 49 of the middle bulk region 22b. Dopant ions are then implanted in the central bulk region 22b. The central bulk region 22b thus becomes a doped well region 22b for the subsequent formation of transistors. In the embodiment of FIG. 11 the central bulk region 22b will be an NMOS transistor region in which NMOS transistors will be formed. As such, the bulk region 22b will be doped with P type dopants in order to act as a body region for the NMOS transistors. In other embodiments the doping of the central bulk region 22b could take place prior to formation of the deep trench isolation regions 28. For example, the epitaxial growth that enlarged the semiconductor layer 49 to the current size could be done in the presence of P type dopants such that the entire semiconductor layer 49 would be lightly doped with P type dopants.

Figure 13:
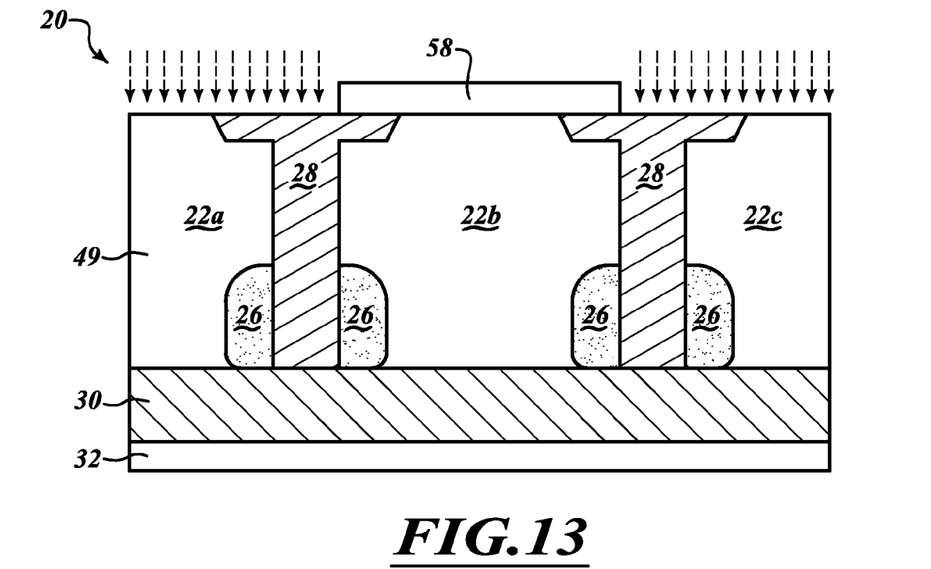

In FIG. 13 the photo resist layer 56 has been stripped and photoresist layer 58 has been deposited and patterned to expose the surface of the semiconductor layer 49 above the left and right bulk regions 22a, 22c. Dopant ions are then implanted into bulk regions 22a, 22c so that bulk regions 22a, 22c are doped well regions 22a, 22c. In one embodiment the bulk regions 22a, 22c will host PMOS transistors. As such, bulk regions 22a, 22c will be doped with N type dopants in order to act as body regions for PMOS transistors that will be formed in the bulk regions 22a, 22c.

Of course the bulk regions 22a, 22c can be formed at an earlier stage in processing, for example, prior to formation of the deep trench isolation regions 28. If, for example, the semiconductor layer 49 is formed in the presence of P type dopants as described above, then bulk regions 22a, 22c can then be doped heavily with N type dopants prior to formation of the isolation trench regions 28. Of course there are many possible schemes for doping the bulk regions prior to formation of transistors as will be apparent to those of skill in the art. All such schemes and processes fall within the scope of the present disclosure.

Figure 14:
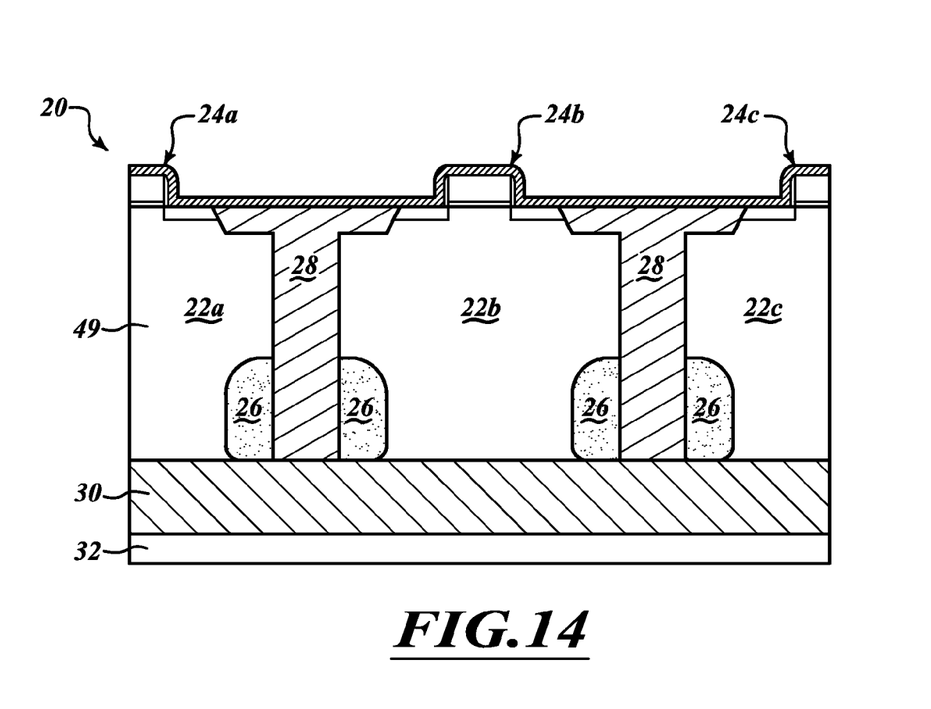

In FIG. 14 transistors 24a, 24b, and 24c have been formed in bulk regions 22a, 22b, and 22c respectively. Transistor 24a is, in one example, a PMOS transistor formed in bulk region 22a which is an N-well region for formation of PMOS transistors. Transistor 24b is, in one example, an NMOS transistor formed in bulk region 22b which is a P-well region for formation of NMOS transistors. Transistor 24c is, in one example, a PMOS transistor formed in bulk region 22c which is an N-well region for formation of PMOS transistors.

The transistors 24a, 24b, and 24c may be formed according to any suitable process. Many such processes are well known to those of skill in the art. The details of formation of transistors 24a, 24b, and 24c will not be described herein in further detail.

While FIG. 14 illustrates a respective single transistor 24a, 24b, 24c in each bulk region 22a, 22b, 22c, in practice each bulk region may have many such transistors. Furthermore, the bulk regions 22a, 22b, and 22c extend into and out of the plane of the page. Many more such bulk regions are formed in the semiconductor layer 49 throughout the die 20. These bulk regions are generally separated from each other by deep trench isolation regions 28. Because the deep trench isolation regions 28 extend from the upper surface of the semiconductor layer 49 to the buried insulator layer 30, the bulk regions 22a, 22b, 22c are completely isolated from each other electrically. There will generally be no leakage currents between the bulk regions 22a, 22b, 22c. There will also not be crosstalk or latch up problems between the bulk regions 22a, 22b, 22c. The transistors 24a, 24b, 24c will have better and more reliable performance characteristics due to the excellent isolation qualities of the isolation regions 28 and the buried insulator layer 30.

Traditionally such transistors would still suffer disturbance from the effects of impurity atoms such as free copper and nickel atoms in the bulk regions 22a, 22b, 22c due to the difficulty of gettering such regions. Free impurity atoms such as copper or nickel can enter into the source, drain, or channel region of a transistor and create many problems with transistor function, such as creating mid band gap energy states in the band gap between the valence band energy and conduction band energy. In a monocrystalline semiconductor substrate there should be no energy states in the band gap. Unwanted impurity atoms such as Au and Cu create such forbidden energy states. Electrons that should be in either the valence band or the conduction band become trapped in a forbidden energy state created by the impurity atoms. Impurity atoms in the bulk regions 22a, 22b, 22c also cause dislocation type defects in the semiconductor lattice of the bulk regions 22a, 22b, 22c. Impurity atoms in the bulk regions 22a, 22b, 22c also cause junction leakage which affects both function of the transistor and power efficiency.

Unwanted impurity atoms such as Cu, Au, Fe, etc. are distinguished from dopant atoms in the present disclosure. Unwanted impurity atoms are typically mobile in a monocrystalline semiconductor lattice at standard operating temperatures T<150° C. Dopant atoms are typically not mobile in the semiconductor substrate at standard operating temperatures. Furthermore dopant atoms are intentionally placed in the semiconductor substrate. Dopant atoms may be mobile in the semiconductor substrate when semiconductor substrate is heated to very high temperatures, such as during an annealing step in which the temperature may brought to temperatures in the range of 1000° C. At these elevated temperatures dopant atoms become slightly mobile and diffuse into the semiconductor substrate. However when the semiconductor substrate is cooled the dopant atoms become part of the monocrystalline substrate and are no longer mobile. This is in contrast to the impurity atoms that may be mobile in a semiconductor substrate even at standard operating temperatures.

However, in the bulk regions 22a, 22b, 22c of the semiconductor die 20 according to one embodiment, the presence of gettering sites 26 provide for improved function of the transistors 24a, 24b, 24c. Each bulk region 22a, 22b, 22c has a gettering site 26. Each gettering site 26 is formed at a junction of an isolation trench 28 and the buried insulator layer 30. The location of the gettering sites 26 according to one embodiment allows for each bulk region 22a, 22b, 22c to have very effective gettering. The gettering sites 26 act as trapping sites for impurity atoms in the bulk region. These impurity atoms are both drawn to and trapped in the gettering sites 26. The transistors 24a, 24b, 24c can thus have the benefits of SOI trench isolation technology and excellent gettering.

The gettering sites 26 extend into and out of the plane of the figures along with the trench isolation regions 28. The gettering sites 26 contact the isolation regions 28 all along the bottom perimeter of the bulk regions 22a, 22b, 22c. In practice each bulk region 22a, 22b 22c is surrounded by trench isolation regions 28 and gettering sites 26.

Of course, in other embodiments the gettering sites 26 could be situated differently in the bulk regions 22a, 22b, 22c. Furthermore the bulk regions 22a, 22b, 22c may be substantially different than shown in the figures. For example, only a portion of each bulk region 22a, 22b, 22c may be a doped well region. In one embodiment the bulk regions may not be doped well regions at all. The foregoing embodiments are given purely by way of non-limiting example. Many other schemes for implementing gettering sites according to principles of the present disclosure will be apparent to those of skill in the art in light of the present disclosure. All such embodiments fall within the scope of the present disclosure.

Figure 15:
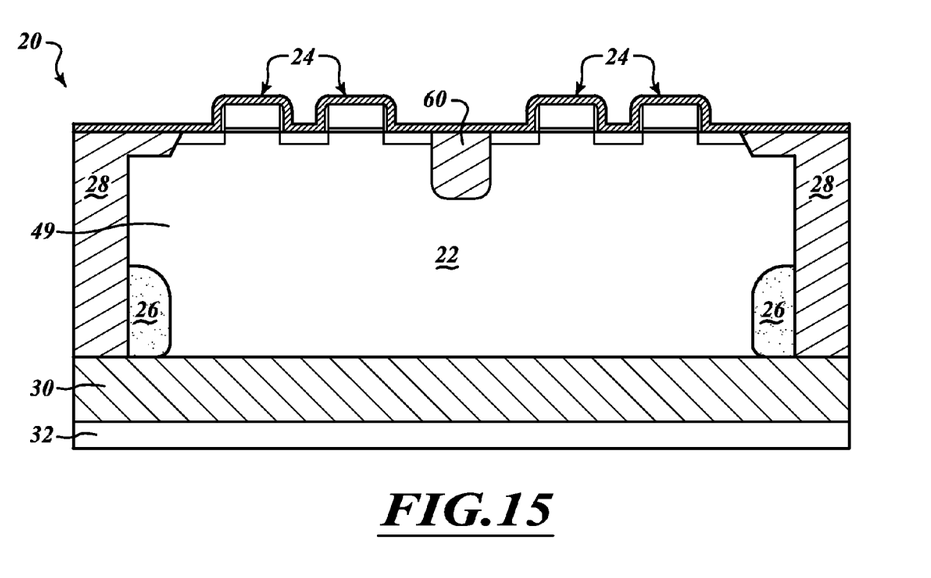
FIG. 15 is a cross section of a completed integrated circuit according to one embodiment.

FIG. 15 illustrates a cross section of a SOI semiconductor device 20. The semiconductor device 20 of FIG. 15 is similar to the semiconductor device 20 of FIG. 14. In FIG. 15 a single bulk region 22 is formed in a monocrystalline semiconductor layer 49 and bounded laterally by deep trench isolation regions 28. The bulk region 22 rests atop an insulating layer 30 as described in relation to prior figures. Gettering sites 26 are located adjacent the deep trench isolation regions 28 and the insulator layer 30 in the bulk region 22. The bulk region 22 is doped with P type dopants and acts as the body region for the four transistors 24 at the top of the bulk region 22. The transistors 24 are N channel transistors.

A shallow trench isolation 60 is formed between the middle two transistors 24 illustrated in FIG. 15. The shallow trench isolation 60 provides electrical isolation between groups of transistors 24. The shallow trench isolation 60 differs from deep trench isolation 28 in that it does not extend to through the semiconductor layer 49 to the isolation layer 30. The shallow trench isolation or LOCOS 60 is silicon dioxide or another dielectric material suitable to provide electrical isolation between transistors 24. The shallow trench isolation 60 helps to reduce cross-talk between transistors 24, wherein electric fields from one transistor 24 may affect the function of another transistor 24 in an undesired fashion.

While FIG. 15 illustrates four transistors 24 and a single shallow trench isolation 60, in practice a bulk region 22 will have many hundreds or thousands of transistors 24 and many shallow trench isolation regions 60. FIG. 15 illustrates a single bulk region 22. However, in practice there may be many bulk regions 22 separated from each other by isolation regions 28 and each containing many transistors 24. Each bulk region 22 will typically be doped with either N or P type dopants. A bulk region 22 doped with N type dopants will typically host a plurality of P type transistors 24. A bulk region 22 doped with P type dopants will typically house a plurality of N type transistors 24.

The gettering regions 26 perform the same gettering functions as described in relation to prior functions. Namely, the gettering regions 26 act as trap sites for impurity atoms in the semiconductor substrate 49. The gettering regions trap impurity atoms and inhibit them from negatively affecting the performance of transistors 24.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a dielectric substrate;
   a semiconductor substrate on the dielectric substrate;
   a plurality of bulk semiconductor regions spaced from each other and located in the semiconductor substrate;
   a plurality of isolation trenches each delineating a boundary of a respective bulk region;
   a respective plurality of transistors in each of the bulk semiconductor regions;
   a plurality of gettering sites in the semiconductor substrate, each gettering site being located in a respective bulk region and in contact with the dielectric substrate and a respective one of the isolation trenches, each gettering site being positioned to not extend directly below any of the respective transistors of the respective bulk region.

2. The device of claim 1 wherein each isolation trench abuts two of the plurality of gettering sites.

3. The device of claim 1 wherein each gettering site comprises a concentration of implanted dopant atoms.

4. The device of claim 3 wherein the impurity atoms are antimony atoms.

5. The device of claim 3 wherein the gettering sites contain impurity atoms in a concentration exceeding $10^{19}$ atoms/cm$^3$.

6. A device, comprising:
   a dielectric substrate;
   a semiconductor substrate on the dielectric substrate;
   a first bulk region in the semiconductor substrate including a transistor of a first conductivity type;
   a second bulk region in the semiconductor substrate including a transistor of a second conductivity type;
   a first gettering site in the first bulk region adjacent the dielectric substrate;
   a second gettering site in the second bulk region adjacent the dielectric substrate; and
   an isolation trench in the semiconductor substrate separating the first bulk region from the second bulk region, the isolation trench being in contact with the dielectric substrate, the first gettering site, and the second gettering site, the first gettering site being positioned to not extend directly below the transistor of the first conductivity type, the second gettering site being positioned to not extend directly below the transistor of the second conductivity type.

7. The device of claim 6 wherein the first and the second gettering sites include antimony atoms.

8. The device of claim 6 wherein the first bulk region is a doped well region of the second conductivity type and the second bulk region is a doped well region of the first conductivity type.

9. The device of claim 6 wherein the first and second gettering sites each abut the dielectric substrate.

* * * * *